US011610830B2

(12) United States Patent
Schweikert et al.

(10) Patent No.: US 11,610,830 B2
(45) Date of Patent: Mar. 21, 2023

(54) POWER SEMICONDUCTOR MODULE AND METHOD FOR FABRICATING THE SAME

(71) Applicant: Infineon Technologies AG, Neubiberg (DE)

(72) Inventors: Christian Schweikert, Munich (DE);
Juergen Hoegerl, Regensburg (DE);
Olaf Hohlfeld, Warstein (DE);
Waldemar Jakobi, Soest (DE)

(73) Assignee: Infineon Technologies AG, Neubiberg (DE)

( * ) Notice: Subject to any disclaimer, the term of this patent is extended or adjusted under 35 U.S.C. 154(b) by 372 days.

(21) Appl. No.: 16/839,683

(22) Filed: Apr. 3, 2020

(65) Prior Publication Data

US 2020/0321262 A1    Oct. 8, 2020

(30) Foreign Application Priority Data

Apr. 5, 2019   (DE) .......................... 102019108988.3

(51) Int. Cl.
| | | |
|---|---|---|
| *H01L 23/34* | (2006.01) | |
| *H01L 23/52* | (2006.01) | |
| *H01L 23/367* | (2006.01) | |
| *G01K 1/14* | (2021.01) | |
| *H01L 21/48* | (2006.01) | |

(52) U.S. Cl.
CPC .............. *H01L 23/367* (2013.01); *G01K 1/14* (2013.01); *H01L 21/4882* (2013.01)

(58) Field of Classification Search
CPC .............. H01L 23/367; H01L 21/4882; H01L 23/3735; H01L 23/49833; H01L 2224/18; H01L 2224/33181; H01L 23/34; H01L 25/16; H01L 25/50; G01K 1/14

USPC .......................................................... 257/712
See application file for complete search history.

(56) References Cited

U.S. PATENT DOCUMENTS

| | | | | |
|---|---|---|---|---|
| 2008/0224303 A1* | 9/2008 | Funakoshi | ............ | H01L 23/473 257/E23.088 |
| 2009/0140369 A1 | 6/2009 | Lee | | |
| 2013/0228890 A1* | 9/2013 | Eisele | ..................... | H01L 24/83 257/467 |
| 2014/0131709 A1* | 5/2014 | Hauenstein | ........... | H01L 23/492 257/48 |
| 2016/0240510 A1 | 8/2016 | Lien et al. | | |
| 2017/0287875 A1* | 10/2017 | Gao | ..................... | H01L 21/486 |

FOREIGN PATENT DOCUMENTS

| | | |
|---|---|---|
| DE | 102013213448 A1 | 1/2015 |
| EP | 3054480 A2 | 8/2016 |

* cited by examiner

*Primary Examiner* — Theresa T Doan
(74) *Attorney, Agent, or Firm* — Murphy, Bilak & Homiller, PLLC

(57) ABSTRACT

A power semiconductor module includes a power semiconductor chip arranged between a first substrate and a second substrate and electrically coupled to the substrates, and a temperature sensor arranged between the substrates and laterally besides the power semiconductor chip such that a first side of the temperature sensor faces the first substrate and a second side of the temperature sensor faces the second substrate. A first electrical contact of the temperature sensor is arranged on the first side and electrically coupled to the first substrate. A second electrical contact of the temperature sensor is arranged on the second side and electrically coupled to the second substrate.

18 Claims, 4 Drawing Sheets

POWER SEMICONDUCTOR MODULE AND METHOD FOR FABRICATING THE SAME

TECHNICAL FIELD

This disclosure relates in general to a power semiconductor module and a method for fabricating a power semiconductor module.

BACKGROUND

Power semiconductor modules are used in a wide variety of applications, for example in the automotive sector. It may be desired to operate power semiconductor modules in a wide temperature range at low power margins. It may also be desirable to measure the junction temperature of power chips comprised in the power semiconductor modules, for example to increase operating efficiency. However, adding a temperature sensor to power semiconductor modules may complicate the electrical routing and may increase stray inductance in the power semiconductor module. Placing a temperature sensor at the periphery of the power semiconductor module may reduce these problems but may result in incorrect or slow temperature readings. New concepts for power semiconductor modules and new methods for fabricating power semiconductor modules may help to overcome these problems.

The problem on which the invention is based is solved by the features of the independent claims. Further advantageous examples are described in the dependent claims.

SUMMARY

Various aspects pertain to a power semiconductor module, comprising: a power semiconductor chip arranged between a first and a second substrate and electrically coupled to the first and second substrates and a temperature sensor arranged between the first and second substrates and laterally besides the power semiconductor chip such that a first side of the temperature sensor faces the first substrate and a second side of the temperature sensor faces the second substrate, wherein a first electrical contact of the temperature sensor is arranged on the first side and electrically coupled to the first substrate and wherein a second electrical contact of the temperature sensor is arranged on the second side and electrically coupled to the second substrate.

Various aspects pertain to a power semiconductor module, comprising: a power semiconductor chip arranged between a first and a second substrate and electrically coupled to the first and second substrates and a temperature sensor arranged between the power semiconductor chip and the second substrate such that a first side of the temperature sensor faces the power semiconductor chip and a second side of the temperature sensor faces the second substrate, wherein a first and a second electrical contact of the temperature sensor are arranged on the second side and electrically coupled to the second substrate.

Various aspects pertain to a method for fabricating a power semiconductor module, the method comprising: arranging a power semiconductor chip between a first and a second substrate and electrically coupling the power semiconductor chip to the first and second substrates and arranging a temperature sensor between the first and second substrates and laterally besides the power semiconductor chip, such that a first side of the temperature sensor faces the first substrate and a second side of the temperature sensor faces the second substrate, wherein a first electrical contact of the temperature sensor is arranged on the first side and electrically coupled to the first substrate and wherein a second electrical contact of the temperature sensor is arranged on the second side and electrically coupled to the second substrate.

Various aspects pertain to a method for fabricating a power semiconductor module, the method comprising: arranging a power semiconductor chip between a first and a second substrate and electrically coupling the power semiconductor chip to the first and second substrates and arranging a temperature sensor between the power semiconductor chip and the second substrate, such that a first side of the temperature sensor faces the power semiconductor chip and a second side of the temperature sensor faces the second substrate, wherein a first and a second electrical contact of the temperature sensor are arranged on the second side and electrically coupled to the second substrate.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration.

The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "coupled", "attached", or "connected" elements. However, it is also possible that the "coupled", "attached", or "connected" elements are in direct contact with each other.

The semiconductor chip(s) described below may be manufactured from specific semiconductor material, for example Si, SiC, SiGe, GaAs, GaN, or from any other semiconductor material. The power semiconductor modules described below may comprise AC/DC or DC/DC converter circuits, power MOS transistors, power Schottky diodes, JFETs (Junction Gate Field Effect Transistors), power bipolar transistors, logic integrated circuits, etc.

Figure 1:
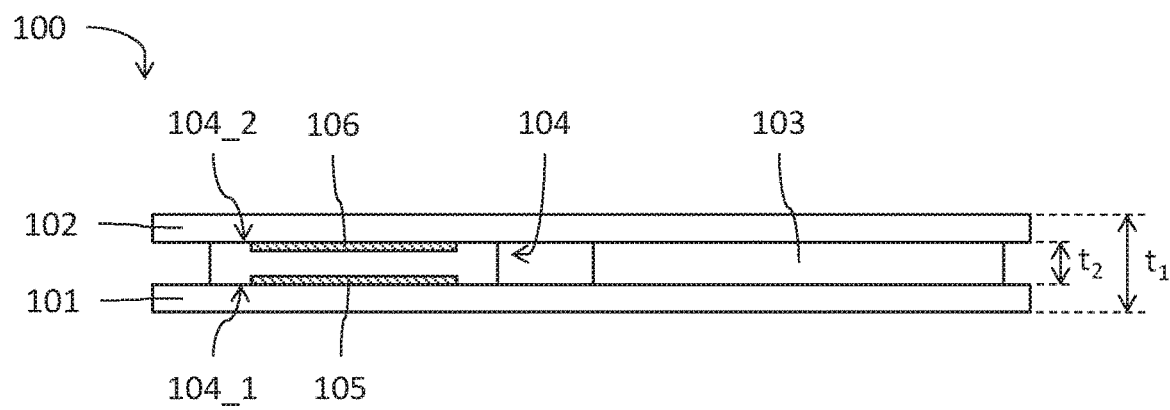
FIG. 1 shows a side view of a first power semiconductor module, wherein a temperature sensor is arranged laterally besides a power semiconductor chip.

FIG. 1 shows a side view of a power semiconductor module 100 that comprises a first substrate 101 and a second substrate 102, a power semiconductor chip 103 and a temperature sensor 104. The first and second substrates 101, 102 are arranged opposite to each other and the power semiconductor chip 103 is arranged between the first and second substrates 101, 102 and is electrically coupled to the first and second substrates 101, 102.

The temperature sensor 104 comprises a first side 104_1 and an opposing second side 104_2, wherein the temperature sensor 104 is arranged between the first and second substrates 101, 102 laterally besides the power semiconductor chip 103 such that the first side 104_1 faces the first substrate 101 and the second side 104_2 faces the second substrate 102. Furthermore, a first electrical contact 105 of the temperature sensor 104 is arranged on the first side 104_1 and is electrically coupled to the first substrate 101 and a second electrical contact 106 of the temperature sensor 104 is arranged on the second side 104_2 and is electrically coupled to the second substrate 102.

The power semiconductor module 100 may be configured to handle high electrical currents and/or high voltages and may for example comprise a half-bridge circuit, a single switch or a three-phase circuit. The power semiconductor module 100 may be configured for use in a vehicle, e.g. an automobile. The power semiconductor module 100 may comprise external contacts, e.g. power contacts and control contacts. According to an example, the power contacts comprise a first power contact configured to be coupled to a positive supply voltage ($V_{DD}$), a second power contact configured to be coupled to a negative supply voltage ($V_{SS}$) and a third power contact configured as phase. The external contacts may be arranged between the first and second substrates 101, 102, e.g. on the first substrate 101 and/or on the second substrate 102 and may e.g. be soldered or sintered to the first and/or the second substrate 101, 102. The external contacts may be part of a leadframe.

The power semiconductor module 100 may be configured for double-sided cooling. That is, the power semiconductor module 100 may be configured to be cooled at the first substrate 101 and to also be cooled at the second substrate 102. For example, a first heat sink may be arranged on the first substrate 101 and a second heat sink may be arranged on the second substrate 102. The heat sink(s) may comprise a metal plate, a cooling channel comprising a cooling fluid, etc. The first and/or second substrates 101, 102 may be coupled to the heat sink(s) directly or they may be coupled to the heat sink(s) indirectly via a layer of thermal interface material.

The power semiconductor module 100 may have any suitable dimensions and shape and may for example have an edge length of 1 cm or more, 5 cm or more, 10 cm or more, etc. The power semiconductor module 100 may also have any suitable overall thickness $t_1$. The overall thickness $t_1$ may for example be 1.5 cm or less, 1.2 cm or less, or 0.8 cm or less. Furthermore, a thickness t2 measured between the first and second substrates 101, 102 may for example be 1.2 cm or less, 1 cm or less, 0.75 cm or less, or 0.65 cm or less.

The first substrate 101 and/or the second substrate 102 may e.g. be a DCB (direct copper bond), a DAB (direct aluminum bond), an AMB (active metal brazing), a PCB (printed circuit board), or a leadframe. The first and second substrates 101, 102 may be of an identical type or they may be of different types. The power semiconductor chip 103 and the temperature sensor 104 may each be electrically coupled to conductive lines of the first substrate 101 and the second substrate 102. External contacts of the power semiconductor module 100 may as well be electrically coupled to the conductive lines.

The power semiconductor chip 103 may e.g. be a FET (field effect transistor) or an IGBT (insulated gate bipolar transistor). The power semiconductor chip 103 may comprise a vertical transistor structure, wherein a first power electrode is arranged on a first side (facing the first substrate 101) and a second power electrode is arranged on a second side (facing the second substrate 102). The first power electrode may be electrically coupled to the first substrate 101 using e.g. a solder joint or a sintered joint. The second power electrode may be electrically coupled to the second substrate 102 using e.g. a solder joint or a sintered joint.

According to an example, a conductive spacer may be arranged between e.g. the second electrode and the second substrate 102. The conductive spacer may e.g. comprise a metal block like a Cu block.

The power semiconductor chip 103 may comprise a control electrode, e.g. a gate electrode, arranged on the second side. The control electrode may be electrically coupled to the second substrate 102, e.g. using a solder joint or a sintered joint. A further conductive spacer may be arranged between the control electrode and the second substrate 102. The further conductive spacer may e.g. comprise a solder ball. Alternatively, it is also possible that the control electrode is electrically coupled to the first substrate 101, e.g. using a bond wire.

The temperature sensor 104 may be any suitable type of temperature sensor. The temperature sensor 104 may e.g. comprise a thermistor, that is a resistor with a temperature dependent electrical resistance. The temperature sensor 104 may e.g. comprise an NTC (negative thermal coefficient).

The temperature sensor 104 may be arranged vertically in the power semiconductor module 100, meaning that the first electrical contact 105 faces the first substrate and the second electrical contact 106 faces the second substrate. Furthermore, a current flow or voltage drop along the temperature sensor 104 may take place between the first and second substrates 101, 102.

The first electrical contact 105 may be electrically coupled to a first external control contact of the power semiconductor module 100 via the first substrate 101 and the second electrical contact 106 may be electrically coupled to a second external control contact of the power semiconductor module 100 via the second substrate 102. According to an example, the first and second external control contacts are both arranged on the first substrate 101 or on the second substrate 102, e.g. side-by-side.

The temperature sensor 104 may be electrically coupled to the first substrate 101 using a solder joint or sintered joint and it may be electrically coupled to the second substrate 102 using a further solder joint or sintered joint. According to an example, a conductive spacer is arranged between the first substrate 101 and the first electrical contact 105 and/or a conductive spacer is arranged between the second electrical contact 106 and the second substrate 102. The conductive spacer(s) may e.g. comprise a metal block like a Cu block. The conductive spacer(s) may be configured to act as heat spreaders.

The temperature sensor 104 may essentially be "flat", meaning that the temperature sensor 104 may have a length and width perpendicular to the direction of $t_1$ that are larger than its thickness along $t_1$. The temperature sensor 104 may e.g. have a length and width of 2 mm or less, 1.5 mm or less, or 1 mm or less. The temperature sensor 104 may e.g. have a thickness of 1 mm or less, 0.5 mm or less, or 0.2 mm or less.

The temperature sensor 104 and the power semiconductor chip 103 are not built monolithically. Instead, the temperature sensor 104 is a separate component and is for example arranged laterally besides the power semiconductor chip 103, e.g. at a defined distance. The exact distance between the temperature sensor 104 and the power semiconductor chip 103 may be a compromise between placing the temperature sensor 104 as close as possible next to the power semiconductor chip 103 to improve the accuracy of temperature sensing and the need to provide electrical routing on the first and second substrates 101, 102 for the power semiconductor chip 103.

According to an example, the power semiconductor module 100 comprises a first power semiconductor chip and a second power semiconductor chip (e.g. the power semiconductor chip 103). The first power semiconductor chip may be a high-side switch (e.g. of a half-bridge circuit) and the second power semiconductor chip may be a low-side switch (e.g. of the half-bridge circuit). In this case, the temperature sensor 104 may be arranged besides the low-side switch and it may be configured to measure the junction temperature at the low-side switch. Placing the temperature sensor 104 next to the low-side switch instead of the high-side switch may reduce the required electrical insulation between the temperature sensor 104 and the respective power semiconductor chip.

According to an example, the power semiconductor module 100 may also comprise a molded body (not shown in FIG. 1). The molded body may e.g. be arranged between the first and second substrates 101, 102. The molded body may encapsulate the power semiconductor chip 103 and it may also encapsulate the temperature sensor 104. The molded body may also be arranged in a gap between the temperature sensor 104 and the power semiconductor chip 103. Outer surfaces of the first and second substrates 101, 102 facing away from the power semiconductor chip 103 and the temperature sensor 104 may not be covered by the molded body.

The temperature sensor 104 may be configured to measure a temperature within the power semiconductor package 100. For example, the power semiconductor chip 103 may produce a certain amount of heat depending on its current workload and the temperature sensor 104 may be configured to measure the current chip temperature. It may be desirable to measure the temperature of the power semiconductor chip 103 very accurately (e.g. within a margin of error of ±2% to 5%) and with very small time delay (e.g. less than a microsecond). This may make it possible to operate the power semiconductor module 100 in a wide temperature range using only a small power margin. Having to account for a wide power margin may increase the cost of a power semiconductor module because more of the expensive power area of a power semiconductor chip has to be provided to do so.

The temperature sensor 104 is electrically coupled to both substrates 101, 102 and may therefore require less space (in particular less space for electrical routing) on each individual substrate 101, 102 compared to a sensor that has both of its contacts coupled to the same substrate. The temperature sensor 104 may also require less vertical space (along the direction of $t_1$) compared to common temperature sensors (which may have a height of 1.2 mm along the direction of $t_1$).

Using a separate temperature sensor 104 and power semiconductor chip 103 instead of monolithically integrating both components into a single chip may help to save costs. For example, the power semiconductor chip 103 may comprise of SiC, which may be several times more expensive than the material the temperature sensor 104 is comprised of.

Figure 2:
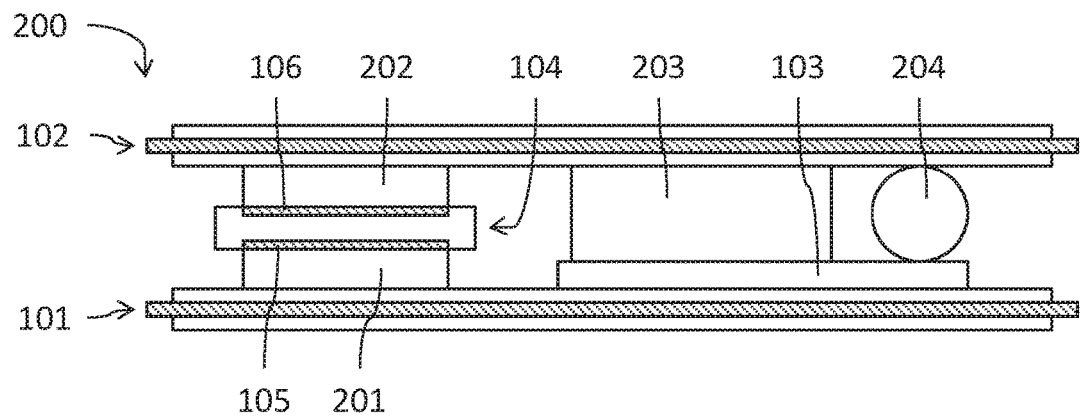
FIG. 2 shows a side view of a second power semiconductor module, wherein a temperature sensor is arranged laterally besides a power semiconductor chip between to heat spreaders.

FIG. 2 shows a side view of a further power semiconductor module 200. The power semiconductor module 200 may be similar or identical to the power semiconductor module 100, except for the differences described in the following.

The power semiconductor module 200 comprises the first and second substrates 101, 102, the power semiconductor chip 103 and the temperature sensor 104. The power semiconductor module 200 may furthermore comprise a first conductive spacer 201, a second conductive spacer 202 and a third conductive spacer 203.

The first and second conductive spacers 201, 202 may also be termed "heat spreaders" and they may be configured to distribute heat generated by the power semiconductor chip 103 across the temperature sensor 104.

The first conductive spacer 201 may be arranged between the temperature sensor 104 (in particular the first electrical contact 105) and the first substrate 101 and the second conductive spacer 202 may be arranged between the temperature sensor 104 (in particular the second electrical contact 106) and the second substrate 102. The third conductive spacer 203 may be arranged between the power semiconductor chip 103 (in particular a power electrode) and the second substrate 102. The conductive spacers 201, 202 and 203 may be coupled to the first and/or second substrates 101, 102 using solder joints or sintered joints. The conductive spacers 201, 202 and 203 may be coupled to the temperature sensor 104 and power semiconductor chip 103, respectively, using solder joints or sintered joints. According to an example, at least some of the solder joints may comprise diffusion solder. The conductive spacers 201, 202 and 203 may be metal blocks and may comprise a suitable metal like Al or Cu or a metal alloy.

According to an example, the first and second conductive spacers 201, 202 may have smaller lateral dimensions than the temperature sensor 104. In particular, the temperature sensor 104 may extend beyond a circumference of the first and second conductive spacers 201, 202 in all lateral directions as shown in FIG. 2. This may reduce the risk of voltage flashovers between the first and second conductive spacers 201, 202.

According to another example, the conductive spacers 201, 202 may instead have greater lateral dimensions than the temperature sensor 104 and may in particular extend beyond a circumference of the temperature sensor 104 in all lateral directions.

The power semiconductor module 200 may also comprise one or more contact balls 204 arranged between the power semiconductor chip 103 and the second substrate 101. The contact ball(s) 204 may e.g. consist of a solder material. The one or more contact balls 204 may be configured to couple one or more control electrodes (e.g. a gate electrode) on the power semiconductor chip 103 to the second substrate 102. According to an example, bond wires are used instead of contact balls. According to yet another example, one or more further conductive spacers are used instead of contact balls.

Figure 3:
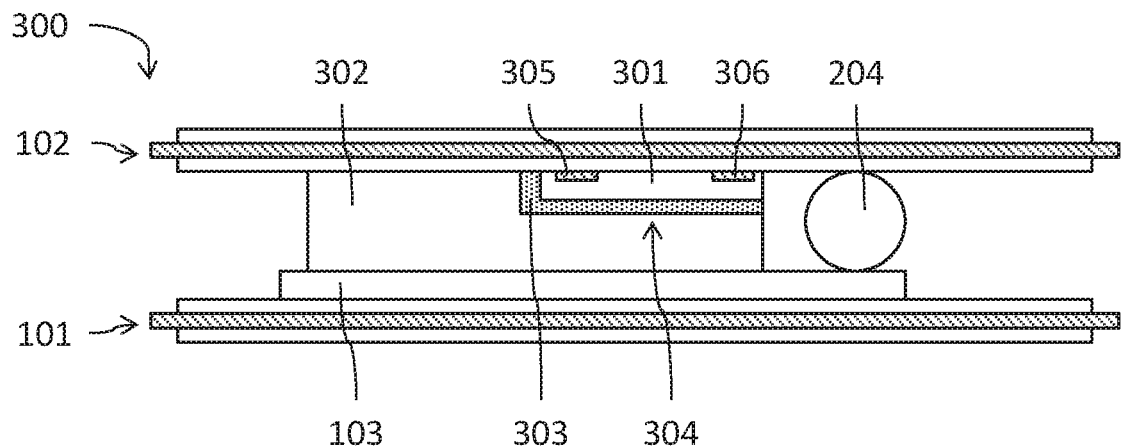
FIG. 3 shows a side view of a third power semiconductor module, wherein a temperature sensor is arranged on top of a power semiconductor chip.

FIG. 3 shows a side view of a further power semiconductor module 300, which may be similar or identical to the power semiconductor modules 100 and 200, except for the differences described below.

Instead of the arranging the temperature sensor and power semiconductor chip laterally side-by-side as shown for the power semiconductor modules 100 and 200, in the power semiconductor module 300 the temperature sensor 301 is arranged on top of the power semiconductor chip 103. A first side of the temperature sensor 301 faces the power semiconductor chip 103 and an opposing second side faces the second substrate 102.

The power semiconductor module 300 comprises a conductive spacer 302 coupling a power electrode of the power semiconductor chip 103 to the second substrate 102. The conductive spacer 302 comprises a cavity 304 and the temperature sensor 301 is arranged within the cavity 304. The conductive spacer 302 may be identical to the third conductive spacer 203 of the power semiconductor module 200 except for the cavity 304.

The cavity 304 may e.g. have the form of a step, a cutout or an essentially rectangular indention in the conductive spacer 302. The cavity 304 may be arranged at a distal end of the conductive spacer facing the second substrate 102 such that the temperature sensor 301 within the cavity may be coupled to the second substrate 102. The temperature sensor 301 may for example be in direct contact with the second substrate 102. The conductive spacer 302 may be configured such that an electrical current can flow through the conductive spacer 302 laterally besides the cavity 304 between the power semiconductor chip 103 and the second substrate 102.

An insulating layer 303 may be arranged between the conductive spacer 302 and the temperature sensor 301. The insulating layer 303 may be configured to electrically insulate the temperature sensor 301 from the conductive spacer 302 (and also from the power semiconductor chip 103). The insulating layer 303 may for example comprise a polymer, a plastic or a ceramic. The insulating layer 303 may be sufficiently thick to effectively insulate the temperature sensor 301 from the conductive spacer 302.

According to an example, the insulating layer 303 may be provided on the temperature sensor 301. During fabrication of the power semiconductor module 300, the temperature sensor 300 with the insulating layer 303 already applied is arranged within the cavity 304. According to another example, the insulating layer 303 is provided on the surface of the cavity 304. In this case, during fabrication of the power semiconductor module 300, the temperature sensor 301 is arranged in the cavity 304 on top of the insulating layer 303. In any case, providing the insulating layer 303 may comprise depositing the insulating layer 303 using a suitable surface coating technique.

According to an example, the temperature sensor 301 may be provided in the form of an encapsulated die (e.g. an encapsulated NTC) and the insulating layer 303 may correspond to the encapsulation body.

According to an example, in the case that the insulating layer 303 is provided on the temperature sensor 301, it may be necessary to trim the insulating layer 303 such that the temperature sensor 301 neatly fits into the cavity 304. Trimming may for example comprise laser trimming for high accuracy.

The insulating layer 303 may cover the temperature sensor 303 only on those sides that face the conductive spacer 302. However, according to an example it is also possible that the insulating layer 303 covers additional sides of the temperature sensor 301, in particular all sides.

The temperature sensor 301 may comprise a first electrical contact 305 and a second electrical contact 306. The first and second electrical contacts 305, 306 may both be arranged on the second side of the temperature sensor 301 facing the second substrate 102. The first and second electrical contacts 305, 306 may be coupled to conductive lines on the second substrate 102. In the case that the insulating layer 303 covers the second side of the temperature sensor 301, the first and second electrical contacts 305, 306 may be exposed at the insulating layer 303.

In contrast to the temperature sensor 104, the temperature sensor 301 may not comprise electrical contacts on opposing sides but only on one side (e.g. the second side as described above). Therefore, a current flow or voltage drop through the temperature sensor 301 may take place in a horizontal direction (perpendicular to the direction of $t_1$) instead of a vertical direction.

Apart from the differences described above, the temperature sensor 301 may be identical to the temperature sensor 104 of the power semiconductor modules 100 and 200.

Placing the temperature sensor 301 above the power semiconductor chip 103 may offer the benefit of very fast and accurate measurements of the junction temperature. The temperature sensor 301 may also be less influenced by a thermal stray field within the power semiconductor module 300. The arrangement of the temperature sensor 301 in the power semiconductor module 300 may also be less space consuming than other arrangements (e.g. lateral arrangements). Furthermore, according to an example, the temperature sensor 301 may be arranged in the cavity 304 without a soldering step.

Figure 4:
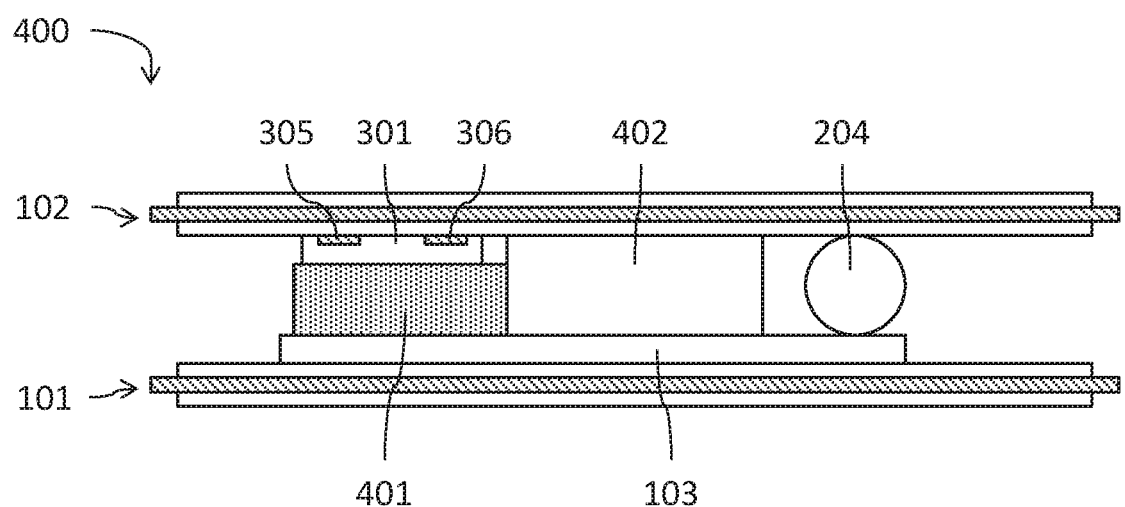
FIG. 4 shows a side view of a fourth power semiconductor module, wherein a temperature sensor is arranged on top of an insulating layer above a power semiconductor chip.

FIG. 4 shows a side view of another power semiconductor module 400, which may be similar or identical to the power semiconductor module 300, except for the differences described in the following.

In the power semiconductor module 400, the temperature sensor 301 is not arranged within a cavity of a conductive spacer. Instead, the temperature sensor 301 is arranged on an insulating carrier 401. The insulating carrier 401 is arranged between the power semiconductor chip 103 and the second substrate 102 and it may be configured to electrically insulate the temperature sensor 301 from the power semiconductor chip 103. Furthermore, a conductive spacer 402 may be arranged between the power semiconductor chip 103 and the second substrate 102 (laterally besides the insulating carrier 401).

The temperature sensor 301 may be arranged on the insulating carrier 401 such that it is in direct contact with the second substrate 102. A solder joint or sintered joint may be used to couple the temperature sensor 301 (in particular the electrical contacts 305, 306) to the second substrate 102. In the case that a solder joint is used, any suitable solder, e.g. a diffusion solder may be used.

The insulating carrier 401 may comprise or consist of any suitable electrically insulting material. For example, the insulating carrier 401 may comprise or consist of ceramic, plastic or polymer. The insulating carrier 401 may consist of a cohesive block of material. The insulating carrier 401 may e.g. be arranged on the power semiconductor chip 103 using a pick-and-place process. According to an example, the insulating carrier 401 may be attached to the power semiconductor chip 103, e.g. using glue. Furthermore, the temperature sensor 301 may be attached to the insulating carrier 401, e.g. using glue.

The conductive spacer 402 may be identical to the conductive spacer 302 of the power semiconductor module 300, except that it does not need to comprise a cavity for the temperature sensor 401.

The insulating carrier 401 and the conductive spacer 402 may abut one another or there may be a gap between the insulating carrier 401 and the conductive spacer 402. Furthermore, there may also be a gap between the temperature sensor 401 and the conductive spacer 402. The power semiconductor module 400 may comprise a molded body and mold material may in particular be arranged in a gap between the insulating carrier 401 and the conductive spacer 402 and/or in a gap between the temperature sensor 301 and the conductive spacer 402.

Compared to the power semiconductor module 300, it may be easier to arrange the temperature sensor 301 on the insulating carrier 401 instead of arranging it in the cavity 304. However, the arrangement of the temperature sensor 301 in the power semiconductor module 400 may still offer the benefit of very fast and accurate temperature measurements mentioned with respect to the power semiconductor module 300.

Figure 5:
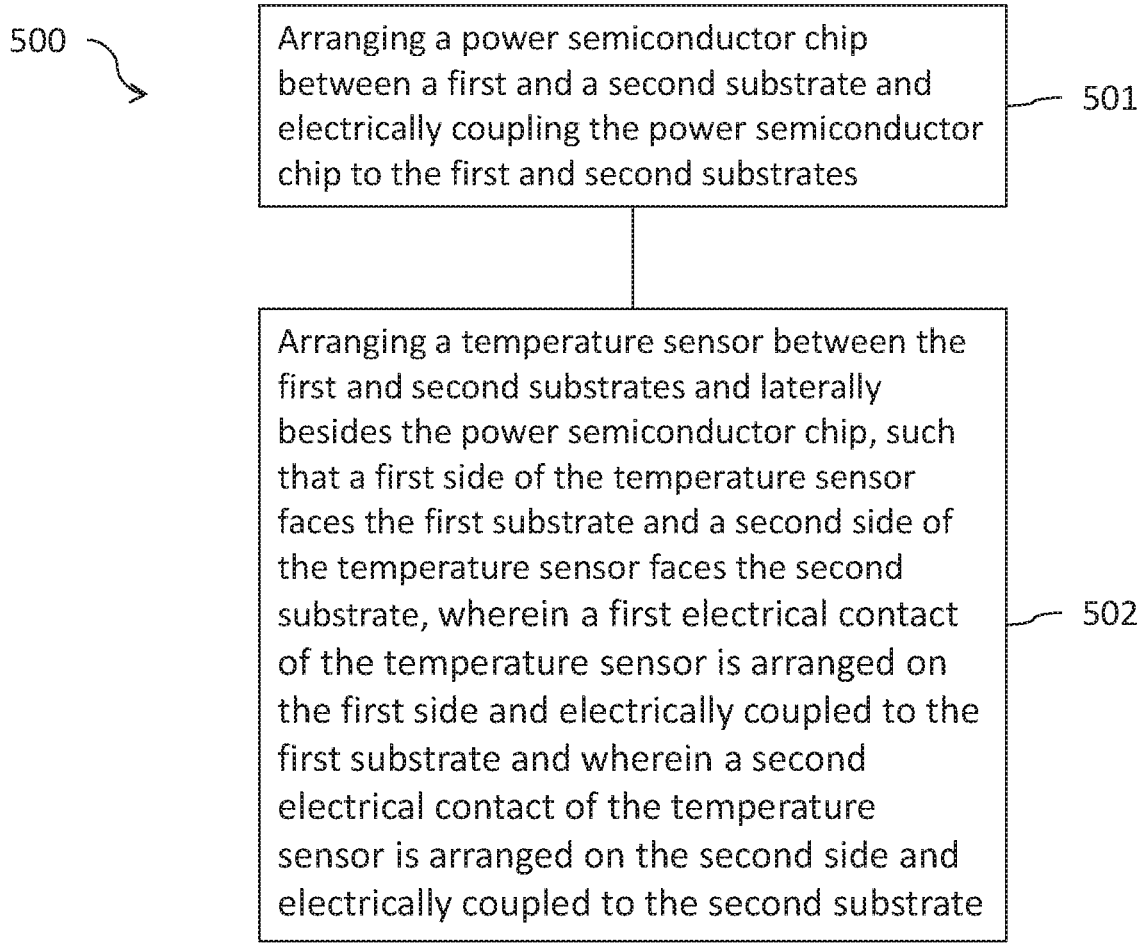
FIG. 5 shows a flow chart of a method for fabricating a power semiconductor module.

FIG. 5 shows a flow chart of a method 500 for fabricating a power semiconductor module. The method 500 may for example be used to fabricate the power semiconductor modules 100 and 200.

The method 500 comprises at 501 arranging a power semiconductor chip between a first and a second substrate and electrically coupling the power semiconductor chip to the first and second substrates and at 502 arranging a temperature sensor between the first and second substrates and laterally besides the power semiconductor chip, such that a first side of the temperature sensor faces the first substrate and a second side of the temperature sensor faces the second substrate, wherein a first electrical contact of the temperature sensor is arranged on the first side and electrically coupled to the first substrate and wherein a second electrical contact of the temperature sensor is arranged on the second side and electrically coupled to the second substrate.

Figure 6:
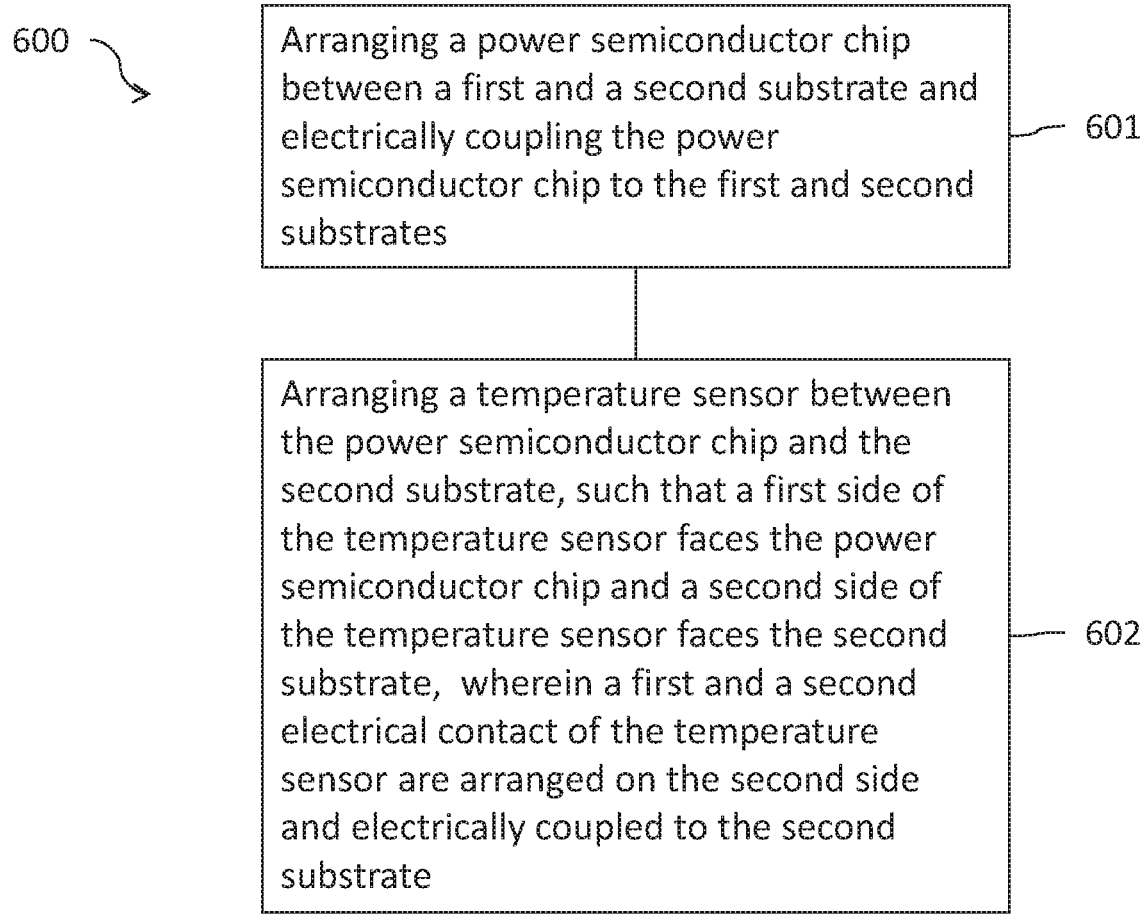
FIG. 6 shows a flow chart of a further method for fabricating a power semiconductor module.

According to an example, the method 500 further comprises arranging a first heat spreader between the first side of the temperature sensor and the first substrate and arranging a second heat spreader between the second side and the second substrate. The method 500 may also comprise FIG. 6 shows a flow chart of a further method 600 for fabricating a power semiconductor module. The method 600 may for example be used to fabricate the power semiconductor modules 300 and 400.

The method 600 comprises at 601 arranging a power semiconductor chip between a first and a second substrate and electrically coupling the power semiconductor chip to the first and second substrates and at 602 arranging a temperature sensor between the power semiconductor chip and the second substrate, such that a first side of the temperature sensor faces the power semiconductor chip and a second side of the temperature sensor faces the second substrate, wherein a first and a second electrical contact of the temperature sensor are arranged on the second side and electrically coupled to the second substrate.

According to an example, the method 600 further comprises arranging an electrically conductive spacer between the power semiconductor chip and the second substrate and electrically coupling a power electrode of the power semiconductor chip to the second substrate using the spacer.

In the following, the power semiconductor modules and the methods for fabricating a power semiconductor module are further explained using particular examples.

Example 1 is a power semiconductor module, comprising: a power semiconductor chip arranged between a first and a second substrate and electrically coupled to the first and second substrates, a temperature sensor arranged between the first and second substrates and laterally besides the power semiconductor chip such that a first side of the temperature sensor faces the first substrate and a second side of the temperature sensor faces the second substrate, wherein a first electrical contact of the temperature sensor is arranged on the first side and electrically coupled to the first substrate and wherein a second electrical contact of the temperature sensor is arranged on the second side and electrically coupled to the second substrate.

Example 2 is the power semiconductor module of example 1, further comprising: a first heat spreader and a second heat spreader, the first heat spreader being arranged between the first side of the temperature sensor and the first substrate and the second heat spreader being arranged between the second side and the second substrate.

Example 3 is the power semiconductor module of example 2, wherein the first heat spreader is a first metal block and wherein the second heat spreader is a second metal block.

Example 4 is the power semiconductor module of examples 2 or 3, wherein the temperature sensor extends beyond a circumference of the first and second heat spreaders in all lateral directions.

Example 5 is the power semiconductor module of one of examples 2 to 4, wherein the temperature sensor is coupled to the first and second heat spreaders using diffusion solder.

Example 6 is the power semiconductor module of one of the preceding examples, wherein the temperature sensor comprises a resistor with a negative thermal coefficient.

Example 7 is the power semiconductor module of one of the preceding examples, wherein the first and second substrates are substrates of one of the following types: direct copper bond, direct aluminum bond or active metal brazing.

Example 8 is a power semiconductor module, comprising: a power semiconductor chip arranged between a first and a second substrate and electrically coupled to the first and second substrates, a temperature sensor arranged between the power semiconductor chip and the second substrate such that a first side of the temperature sensor faces the power semiconductor chip and a second side of the temperature sensor faces the second substrate, wherein a first and a second electrical contact of the temperature sensor are arranged on the second side and electrically coupled to the second substrate.

Example 9 is the power semiconductor module of example 8, further comprising: an electrically conductive spacer arranged between the power semiconductor chip and the second substrate and electrically coupling a power electrode of the power semiconductor chip to the second substrate.

Example 10 is the power semiconductor module of example 9, wherein the temperature sensor is arranged within a cavity in the spacer.

Example 11 is the power semiconductor module of example 10, further comprising: an electrically insulating layer formed between the temperature sensor and the spacer to electrically insulate the temperature sensor from the spacer.

Example 12 is the power semiconductor module of example 9, further comprising: an electrically insulating carrier arranged between the power semiconductor chip and the second substrate laterally besides the spacer, wherein the temperature sensor is arranged on the carrier and electrically insulated from the power semiconductor chip by the carrier.

Example 13 is the power semiconductor module of example 12, wherein the carrier comprises or consists of ceramic.

Example 14 is the power semiconductor module of one of the preceding examples, further comprising: a solder ball arranged between the power semiconductor chip and the second substrate and electrically coupling a control electrode of the power semiconductor chip to the second substrate.

Example 15 is a method for fabricating a power semiconductor module, the method comprising: arranging a power semiconductor chip between a first and a second substrate and electrically coupling the power semiconductor chip to the first and second substrates, arranging a temperature sensor between the first and second substrates and laterally besides the power semiconductor chip, such that a first side of the temperature sensor faces the first substrate and a second side of the temperature sensor faces the second substrate, wherein a first electrical contact of the temperature sensor is arranged on the first side and electrically coupled to the first substrate and wherein a second electrical contact of the temperature sensor is arranged on the second side and electrically coupled to the second substrate.

Example 16 is the method of example 15, further comprising: arranging a first heat spreader between the first side of the temperature sensor and the first substrate and arranging a second heat spreader between the second side and the second substrate.

Example 17 is a method for fabricating a power semiconductor module, the method comprising: arranging a power semiconductor chip between a first and a second substrate and electrically coupling the power semiconductor chip to the first and second substrates, arranging a temperature sensor between the power semiconductor chip and the second substrate, such that a first side of the temperature sensor faces the power semiconductor chip and a second side of the temperature sensor faces the second substrate, wherein a first and a second electrical contact of the temperature sensor are arranged on the second side and electrically coupled to the second substrate.

Example 18 is the method of example 17, further comprising: arranging an electrically conductive spacer between the power semiconductor chip and the second substrate and electrically coupling a power electrode of the power semiconductor chip to the second substrate using the spacer.

Example 19 is a device comprising means for performing the method of one of examples 15 to 18.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power semiconductor module, comprising:
a power semiconductor chip arranged between a first substrate and a second substrate and electrically coupled to the first substrate and the second substrate; and
a temperature sensor arranged between the power semiconductor chip and the second substrate such that a first side of the temperature sensor faces the power semiconductor chip and a second side of the temperature sensor faces the second substrate,
wherein a first electrical contact and a second electrical contact of the temperature sensor are arranged on the second side and electrically coupled to the second substrate.

2. The power semiconductor module of claim 1, further comprising:
an electrically conductive spacer arranged between the power semiconductor chip and the second substrate and electrically coupling a power electrode of the power semiconductor chip to the second substrate.

3. The power semiconductor module of claim 2, wherein the temperature sensor is arranged within a cavity in the electrically conductive spacer.

4. The power semiconductor module of claim 3, further comprising:
an electrically insulating layer formed between the temperature sensor and the electrically conductive spacer, to electrically insulate the temperature sensor from the electrically conductive spacer.

5. The power semiconductor module of claim 2, further comprising:
an electrically insulating carrier arranged between the power semiconductor chip and the second substrate laterally besides the electrically conductive spacer,
wherein the first side of the temperature sensor faces the electrically insulating carrier and the temperature sensor is electrically insulated from the power semiconductor chip by the electrically insulating carrier.

6. The power semiconductor module of claim 5, wherein the electrically insulating carrier comprises a ceramic.

7. The power semiconductor module of claim 1, wherein the temperature sensor comprises a resistor with a negative thermal coefficient.

8. The power semiconductor module of claim 1, further comprising:
a solder ball arranged between the power semiconductor chip and the second substrate and electrically coupling a control electrode of the power semiconductor chip to the second substrate.

9. A power semiconductor module, comprising:
a power semiconductor chip arranged between a first substrate and a second substrate and electrically coupled to the first substrate and the second substrate; and
a temperature sensor arranged between the first substrate and the second substrate and laterally besides the power semiconductor chip such that a first side of the temperature sensor faces the first substrate and a second side of the temperature sensor faces the second substrate, wherein a first electrical contact of the temperature sensor is arranged on the first side and electrically coupled to the first substrate, wherein a second electrical contact of the temperature sensor is arranged on the second side and electrically coupled to the second substrate.

10. The power semiconductor module of claim 9, further comprising:

a first heat spreader arranged between the first side of the temperature sensor and the first substrate; and a second heat spreader arranged between the second side of the temperature sensor and the second substrate.

11. The power semiconductor module of claim 10, wherein the first heat spreader is a first metal block, and wherein the second heat spreader is a second metal block.

12. The power semiconductor module of claim 10, wherein the temperature sensor extends beyond a circumference of the first heat spreader and a circumference of the second heat spreader in all lateral directions.

13. The power semiconductor module of claim 10, wherein the temperature sensor is coupled to the first heat spreader and the second heat spreader using diffusion solder.

14. The power semiconductor module of claim 9, wherein the temperature sensor comprises a resistor with a negative thermal coefficient.

15. The power semiconductor module of claim 9, wherein the first substrate and the second substrate are selected from the group consisting of: direct copper bond; direct aluminum bond; and active metal brazing.

16. The power semiconductor module of claim 9, further comprising:

a solder ball arranged between the power semiconductor chip and the second substrate and electrically coupling a control electrode of the power semiconductor chip to the second substrate.

17. The power semiconductor module of claim 3, wherein the temperature sensor within the cavity is in direct contact with the second substrate.

18. The power semiconductor module of claim 3, wherein an electrical current can flow through the electrically conductive spacer laterally beside the cavity.

* * * * *